(12) United States Patent
Lin

(10) Patent No.: US 6,329,252 B1
(45) Date of Patent: Dec. 11, 2001

(54) METHOD OF FORMING SELF-ALIGNED CONTACTS

(75) Inventor: Yeh-Sen Lin, Pa-Te (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/393,580

(22) Filed: Sep. 9, 1999

(30) Foreign Application Priority Data

May 25, 1999 (TW) ................................. 88108535

(51) Int. Cl.$^7$ ................................. H01L 21/336
(52) U.S. Cl. ................. 438/279; 438/299; 438/20; 438/254; 438/303; 438/305; 438/624; 438/649; 438/738; 438/743
(58) Field of Search ................. 438/279, 299, 438/303, 305, 20, 624, 649, 738, 743, 254

(56) References Cited

U.S. PATENT DOCUMENTS

| 5,599,749 | * | 2/1997 | Hattori | 458/228 |
| 6,165,880 | * | 12/2000 | Yaung et al. | 438/592 |
| 6,180,472 | * | 7/1999 | Akamatsu et al. | 438/303 |
| 6,214,663 | * | 4/2001 | Cho et al. | 438/253 |
| 6,214,743 | * | 4/2001 | Oiano | 438/723 |

OTHER PUBLICATIONS

S. Wolf, Silicon Processing for the VLSI Era, vol. !, 1986, Lattice Press, pp 185, 192, 193, 550, 551, 546, 555 and 556. .*

* cited by examiner

Primary Examiner—Matthew Smith
Assistant Examiner—B V Keshavan
(74) Attorney, Agent, or Firm—Intellectual Property Solutions, PLLC

(57) ABSTRACT

The invention advantageously provides a novel method for making self-aligned contacts on a semiconductor substrate. A gate electrode having a vertical sidewall and a protecting layer thereon is formed over the semiconductor substrate. A doped region is formed in the substrate adjacent to the gate electrode. An insulating sidewall spacer is formed on the sidewall of the gate electrode. A second doped region is formed in the substrate adjacent to the sidewall spacer. A second protecting layer is formed to cover or blanket the first protecting layer, the sidewall spacer, and the substrate. An interlayer insulting layer is provided on the second protecting layer in order to form a planer surface. The interlayer insulating layer and the second protecting layer are etched to expose the doped regions to form the self-aligned contacts.

20 Claims, 7 Drawing Sheets

METHOD OF FORMING SELF-ALIGNED CONTACTS

BACKGROUND OF THE INVENTION

1. Field of the Invention

The present invention relates to the fabrication of self-aligned contacts on semiconductor devices, and more particularly to a method for making self-aligned source/drain contacts and a well insulated gate electrode using a non-conformal protecting layer.

2. Description of the Related Arts

Because the trend of semiconductor manufacturing towards highly integrated devises, the mis-patterning tolerance is becoming stricter. Recently, a self-aligned contact which partially overlays the source/drain and the gate electrode has been developed to increase the tolerance of mis-patterning and enhance the density of the integrated devises.

A conventional self-aligned contact is typically fabricated by the following procedures. Referring to FIG. 1A, a gate oxide layer 112, a gate electrode layer 114 and a first protecting layer 116 are successively formed over a semiconductor substrate 110. The gate oxide layer 112 is composed of silicon oxide and deposited by high temperature oxidation in an oxygen ambient. The gate electrode 114 is composed of doped polysilicon and deposited by chemical vapor deposition. The first protecting layer 116 is composed of silicon nitride and deposited by chemical vapor deposition. Then, a photolithographic technique and an anisotropical technique are used to pattern these layers.

A lightly doped region 120 is formed by ion implantation using the patterned first protecting layer 116 as the mask. Insulating sidewall spacers 122 are formed on the sidewalls of the gate oxide layer 112, the gate electrode layer 114, and the first protecting layer 116. The insulating sidewall spacers 122 are fabricated by depositing a silicon nitride layer over the substrate 110 and etching it back to the top of the first protecting layer 116. Preferably the sidewall spacers 122 are composed of silicon nitride and formed by, for example, chemical vapor deposition.

A highly doped region 124 is then formed in the substrate areas adjacent to the insulating sidewall spacers 122 by ion implantation using the first protecting layer 116 and the insulating sidewall spacers 122 as the mask.

A second protecting layer 126 is formed to conformally, blanket the first protecting layer 116, the insulating sidewall spacers 122 and the substrate 110. Conventionally, the second protecting layer 126 is a TEOS oxide layer formed by low-pressure chemical vapor deposition using tetra-ethyl-ortho-silicate (TEOS) as the reactant.

Referring to FIG. 1B, a interlayer insulating layer 128 is formed thereon to isolate the transistor and conducting layers which will be formed later and to offer a good planar surface for the following procedure. Preferably, the layer 128 is formed of doped silicon oxide such as borophosphosilicate glass (BPSG) by chemical vapor deposition.

Referring to FIG. 1C, the self-aligned contact 132 is formed. The result is achieved by using the photoresist film 130 as the mask and anisotropically etching the interlayer insulating layer 128 and the second protecting layer 126, usually formed of silicon oxide, until the heavily doped region 124 is exposed. Then, a conducting material 134 is implanted into the self-aligned contact 132 and contacts with the heavily doped region 124, as indicated in FIG. 1D.

Unfortunately, several problems result because the material of the second protecting layer 126, which is usually TEOS oxide, is similar to that of interlayer insulating layer 128, doped silicon oxide. The etching selectivity between TEOS oxide and doped silicon oxide is not high enough. When the interlayer insulating layer 128 is patterned in order to form the self-aligned contact 132, the second protecting layer 126 is easily removed at the same time and can't provide good protection for the gate electrode 114. Without the protection of the second protecting layer 126, it is unavoidable to etch away part of insulating sidewall spacers 122 (silicon nitride) and form a gap in the spacer 122 during the pattering steps. A new spacer 122a is formed and allows the direct contact between the conducting material 134 and the gate electrode 114 through the gap. This generates a short-circuit as indicated in FIG. 1E.

Furthermore, the first protecting layer 116 may be partially etched and another gap formed in the first protecting layer 116 because of the mis-patterning. The resultant is shown in FIG. 1F. Through the gap in the first protecting layer 116, the contacting material 134 may directly contact with the gate electrode 114. This also causes a short-circuit.

SUMMARY OF THE INVENTION

It is therefore an object of the invention to present a method of forming self-aligned contacts which is free of the above problems.

According to the object of the invention, a method of forming self-aligned contacts is provided, which comprises the steps of : providing a semiconductor substrate; forming a gate electrode structure having a vertical sidewall and a first protecting layer thereon over said semiconductor substrate; forming a first doped region in a portion of said semiconductor substrate adjacent to said gate electrode structure; forming a insulating sidewall spacer on said sidewall of said gate electrode structure; forming a second doped region in a portion of said semiconductor adjacent to said sidewall spacer; forming a second protecting layer to non-conformally blanket said first protecting layer, said insulating sidewall spacer, and said semiconductor substrate; forming a interlayer insulating layer on said second protecting layer to form a planar surface; and etching said interlayer insulating layer and said second protecting layer at a determined position to expose said second doped regions, thereby forming said self-aligned contacts.

Other objects, features, and advantages of the present invention will become apparent from the following detailed description which makes reference to the accompanying drawings.

DETAILED DESCRIPTION OF THE INVENTION

Without intending to limit it in any manner, the present invention will be further illustrated by the following examples.

The method of making a self-aligned contact according to the present invention can be applied in a memory cell, such as a DRAM cell having a MOSFET switch element with an N-channel or a P-channel. A DRAM cell having a MOSFET with an N-channel is used as an example.

Figure 1A:
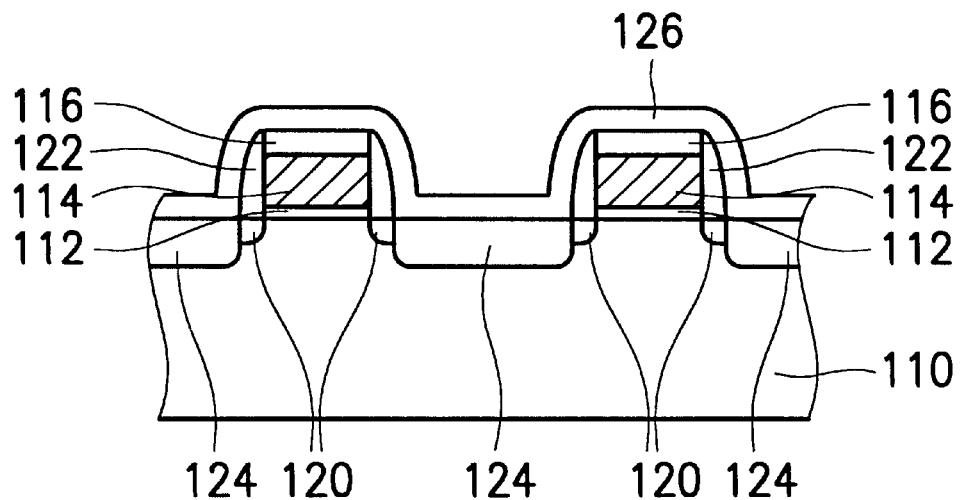
FIGS. 1A through 1D are cross-sectional views illustrating the conventional fabrication steps of self-aligned contacts.
Figure 1B:
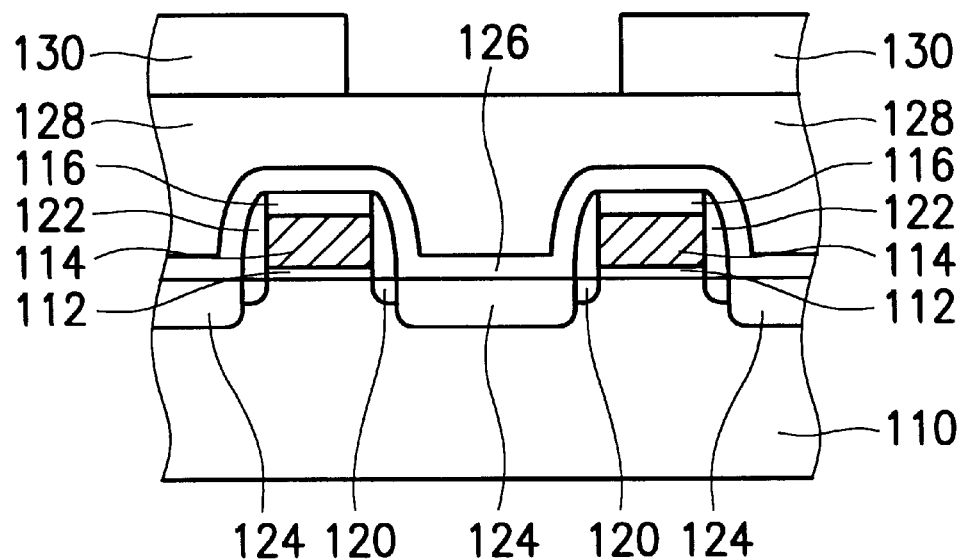
Figure 1C:
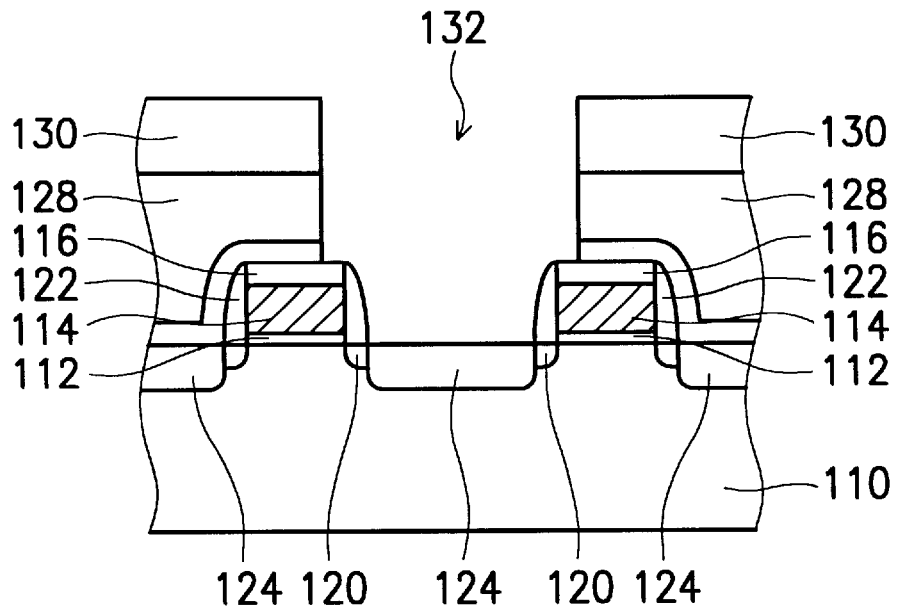
Figure 1D:
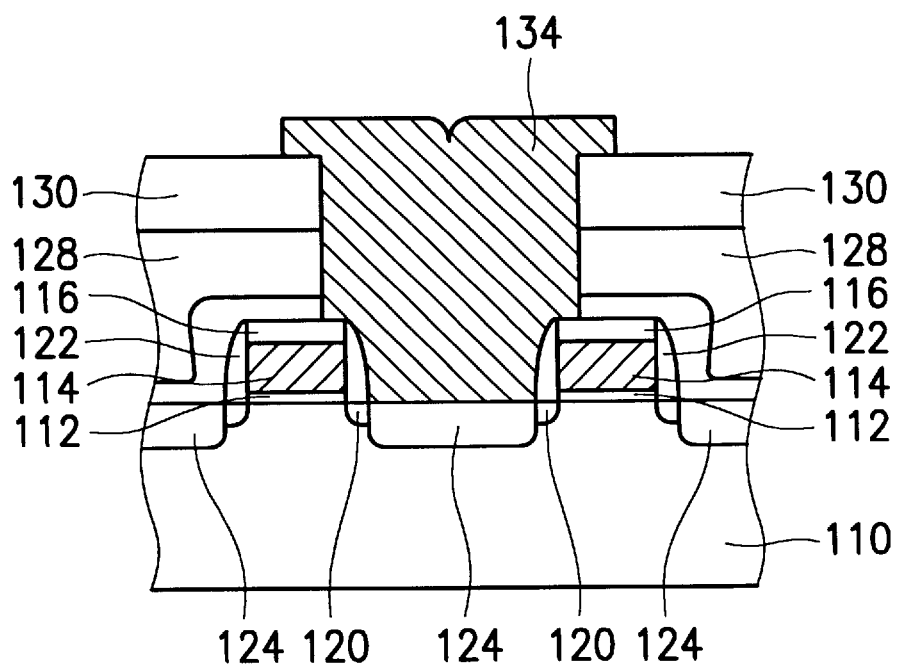
Figure 1E:
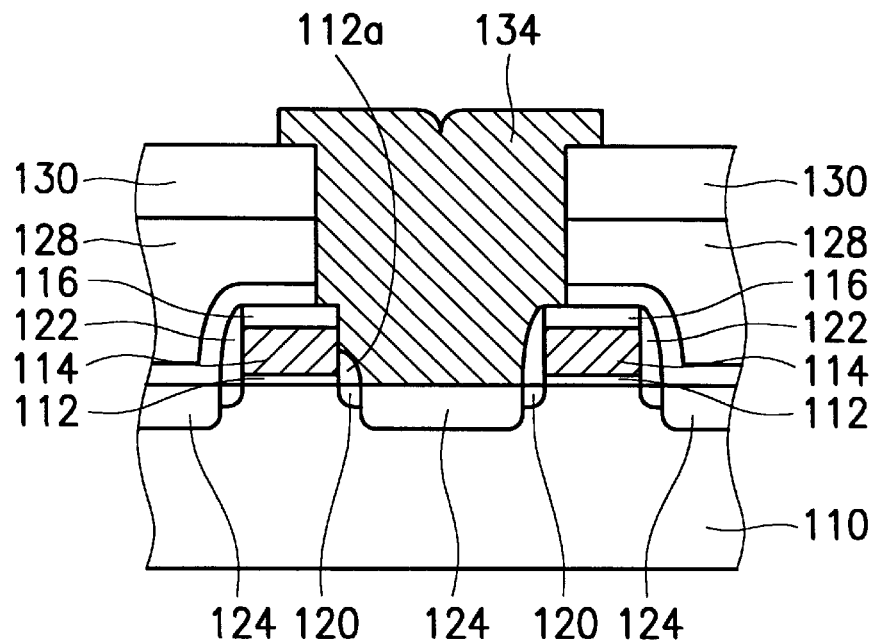
FIGS. 1E through 1F are cross-sectional views illustrating the drawbacks of the conventional fabrication steps of self-aligned contacts.
Figure 1F:
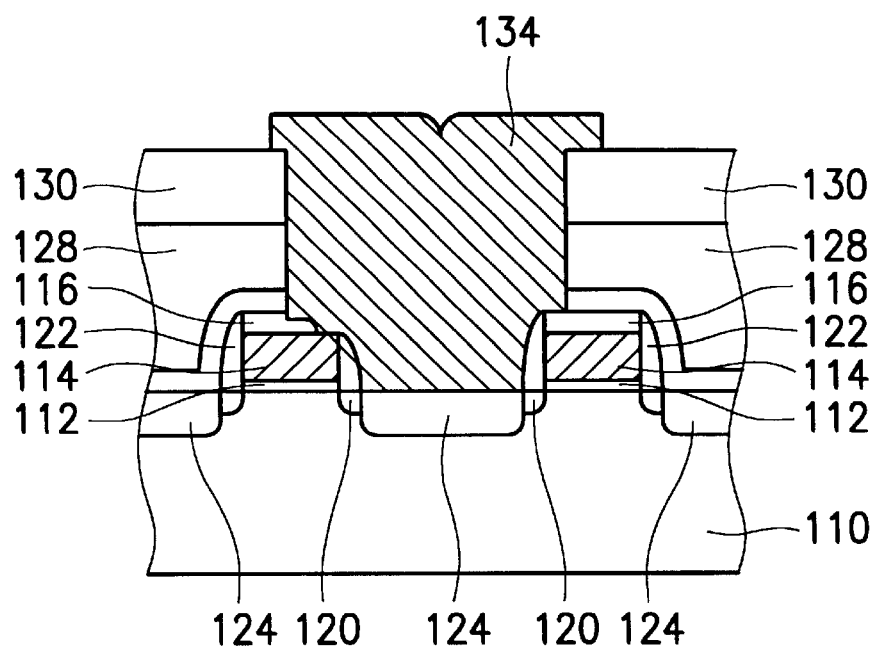
Figure 2A:
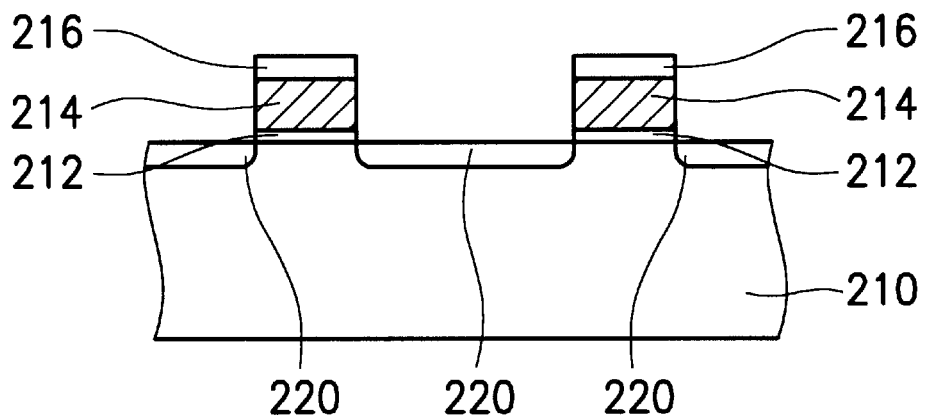
FIGS. 2A through 2G are cross-sectional views illustrating the fabrication steps of the self-aligned contacts according to the present invention.

Referring to FIG. 2A, the first step of the present invention is indicated. A semiconductor substrate 210 is provided. Here, a P-type single crystal silicon having a <100>crystallographic orientation is used as a example. A gate oxide layer 212, a gate electrode layer 214 and a first protecting layer 216 are successively formed over the substrate 210 and are patterned to form a gate electrode structure using photolithography techniques and anisotropic techniques. The gate oxide layer 212 can be a silicon oxide layer which is formed by, for example, a high temperature oxidation procedure in an oxygen ambient. The gate electrode layer 214 can be composed of doped polysilicon. It is deposited by chemical vapor deposition using, for example, silane as the reaction gas and doped by ion implantation using, for example, either arsenic or phosphorus ion. The first protecting layer 216 is preferably composed of silicon nitride which is formed by low-pressure chemical vapor deposition using, for example, the dichlorosilane and ammonium as reactant gases.

A lightly doped region 220 is then formed by ion implantation using the gate electrode structure as the mask. For instance, ion implantation using either arsenic or phosphorus ion can be performed in the P-type substrate.

Figure 2B:
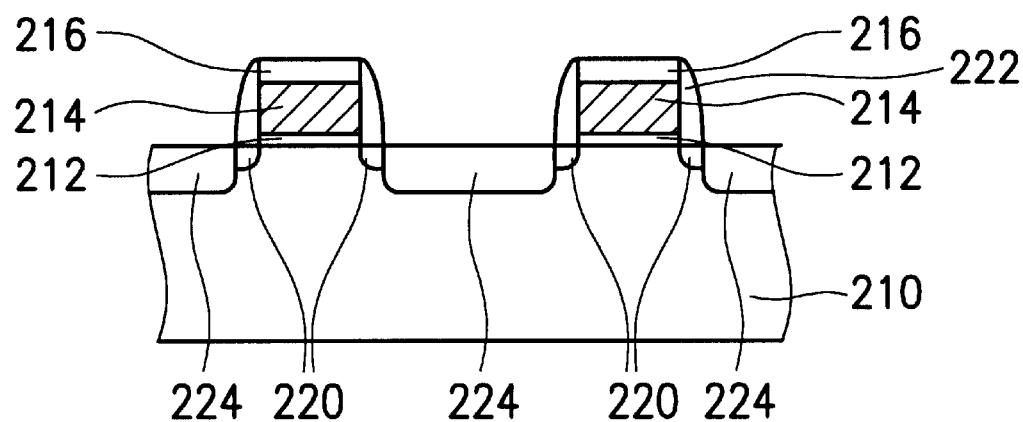

Referring to FIG. 2B, insulating sidewall spacers 222 are formed on the sidewalls of the gate electrode structure. The insulating sidewall spacers 222 are fabricated by depositing and etching back an insulation layer. Typically the material of the spacers 222 is the same as that of the first protecting layer 216. Preferably the spacers are composed of silicon nitride and formed by, for example, low-pressure chemical vapor deposition.

A highly doped region 224 is then formed in the substrate areas adjacent to the insulating sidewall spacers 222. It is formed by ion implantation using the gate electrode structure and the insulating sidewall spacers 222 as the mask. For instance, ion implantation using either arsenic or phosphorus ion can be performed in the P-type substrate.

Figure 2C:
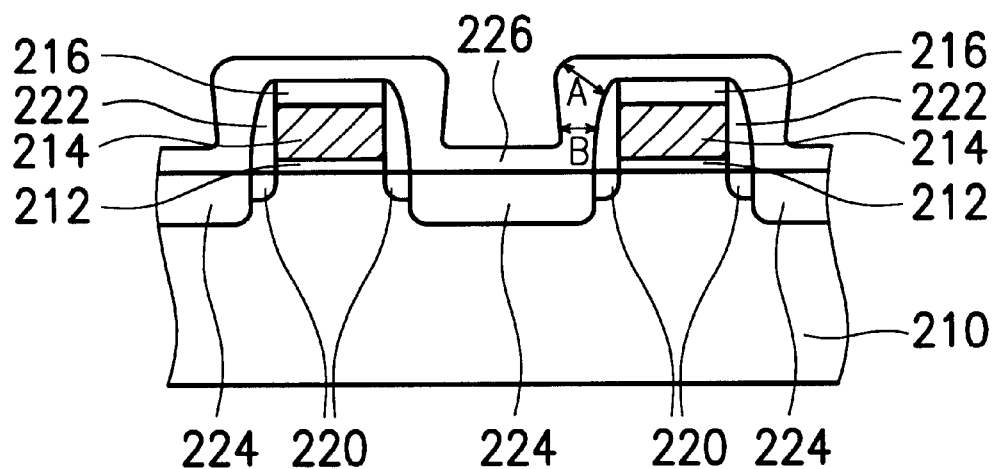

Now, turning to FIG. 2C, a second protecting layer 226 is non-conformally formed thereon by, for example, plasma-enhanced chemical vapor deposition to provide a good insulation for the gate electrode 214. This prevents the gate electrode 214 from being exposed during the following etching procedures and avoids short-circuit. Because the second protecting layer 226 is non-conformal (the width of the shoulder, illustrated as symbol A, is wider than that of the sidewall, illustrated as symbol B), the insulating protection for the gate electrode 214 is better. It also effectively keeps the dopants, derived from the interlayer insulating layer 228 (not shown), from diffusing into the semiconductor substrate 210. The ability of the silicon-containing nitride(s) to retard dopant-diffusing is better than that of the conventional TEOS oxide. Therefore, the second protecting layer 226 is preferably formed of silicon-containing nitride(s) such as silicon nitride and silicon oxynitride.

Figure 2D:
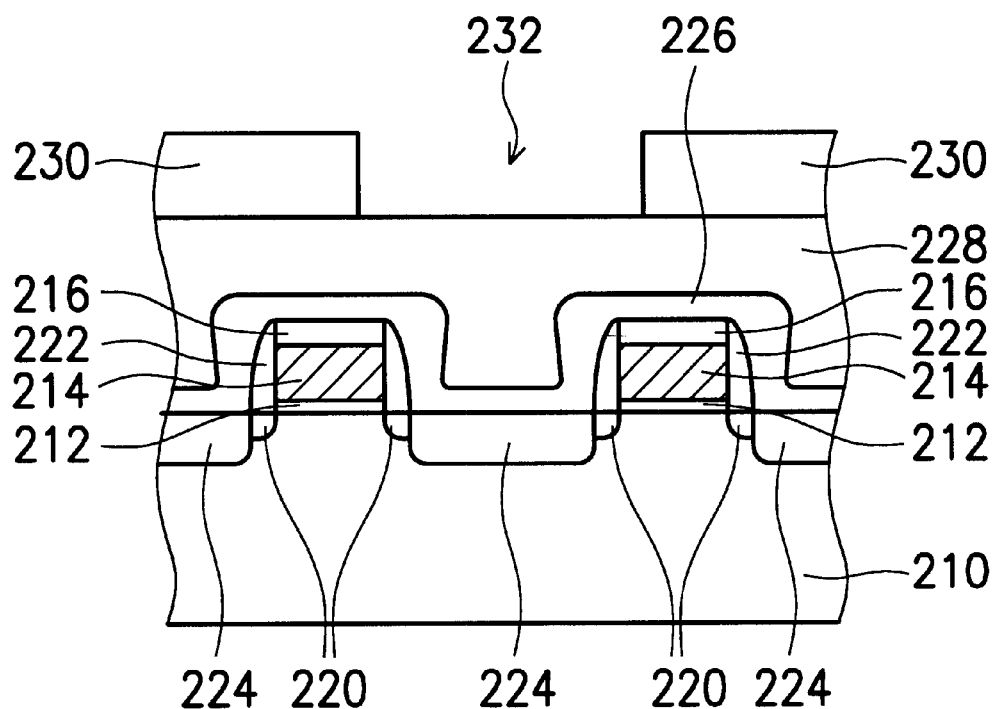

Referring to FIG. 2D, a interlayer insulating layer 228 is formed over the substrate 210 and treated with a thermal flow procedure. The insulating layer 228 is formed of doped silicon oxide such as borophosphosilicate glass, borosilicate glass and phosphosilicate glass and by low-pressure chemical vapor deposition. Then, a patterned photoresist film 230 is formed over the interlayer insulating layer 228. The photoresist film 230 has a first opening 232 which overlays the heavily doped region 224 and partial gate electrode 214.

Figure 2E:
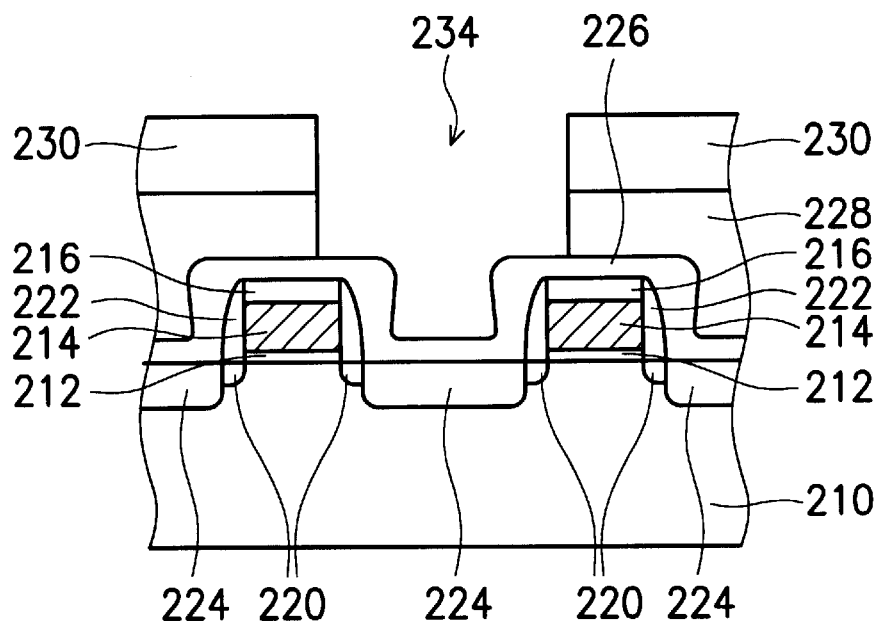

Referring to FIG. 2E, a second opening 234 is formed in the interlayer insultating layer 228. It is formed by anisotropically etching the interlayer insulating layer 228 to the second protecting layer 226 through the first opening 232. The anisotropical etch is performed by reactive ion etch using the etching gas which is more susceptible to silicon oxide than to silicon-containing nitride(s), for example, the $C_4F_8/CF_4/CHF_3$ mixture.

Figure 2F:
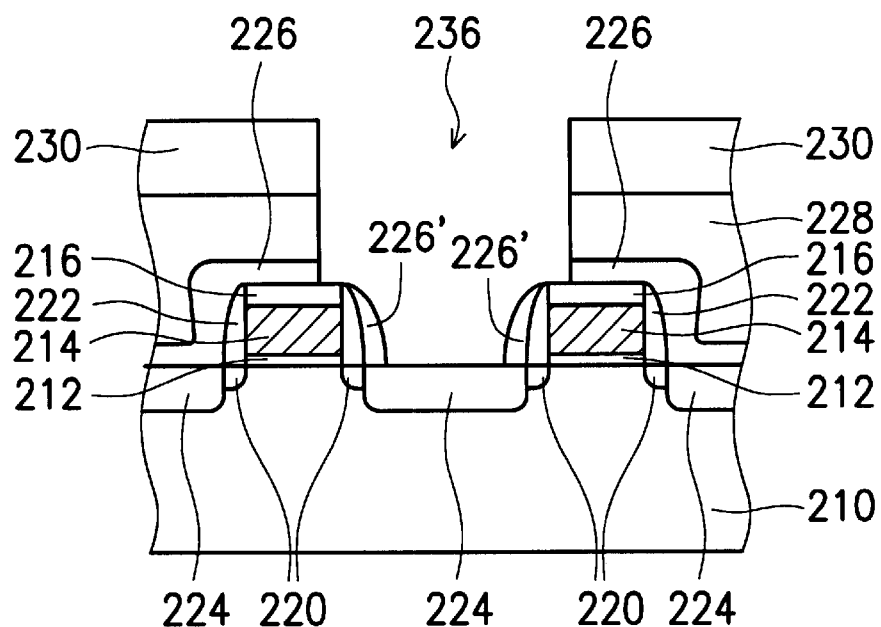

Referring to FIG. 2F, self-aligned contacts 236 are formed by etching the remaining interlayer insulating layer 228 and the second protecting layer 226 to heavily doped region 224 through the second opening 234. A double spacer is obtained from the insulating sidewall spacer 222 and the second protecting layer residue 226'.

Figure 2G:
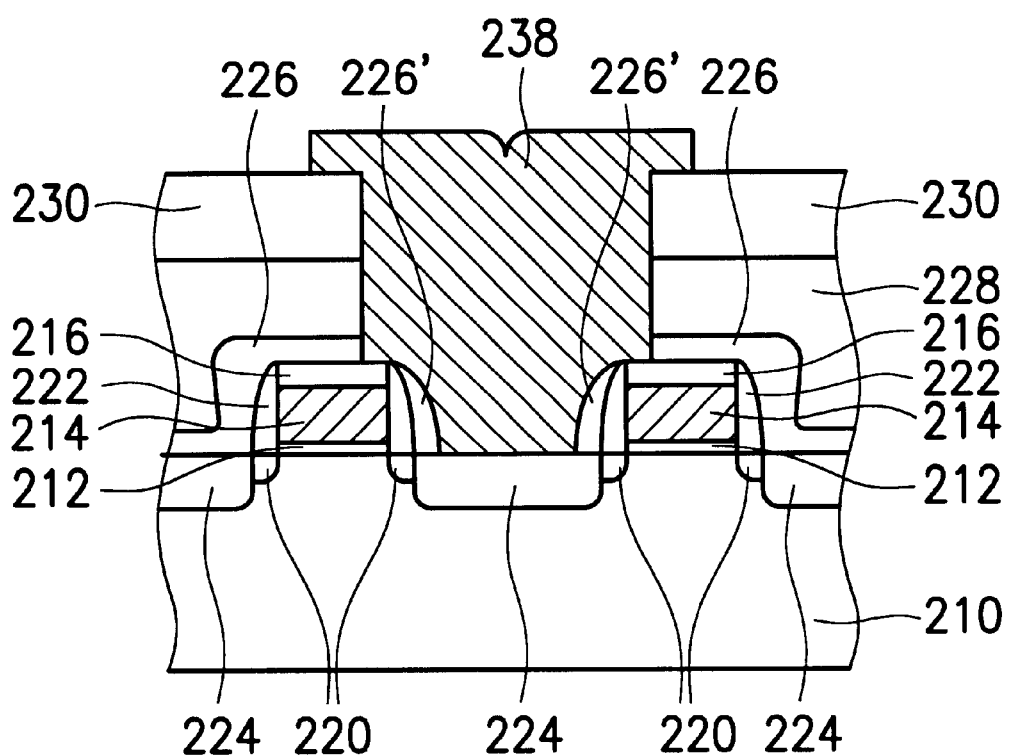

Referring to FIG. 2G, the self-aligned contacts 236 can be filled with a conducting layer 238 which is composed of, for example, polysilicon or metal silicide such as titanium silicide or tungsten silicide.

The present invention is advantageous in the following ways. First, improved insulation for the gate electrode 214 is obtained because the second protecting layer 226 is non-conformal. Second, the heavily doped region 224 is less penetrated by the dopants of the interlayer because the material of the second protecting layer 226 is silicon-containing nitride(s), which has better dopant-retarding ability. Finally, the etching selectivity between silicon-containing nitride(s)and doped silicon oxide is better, so gate electrode 214 is hardly etched during the steps of patterning interlayer insulating layer 228.

While the invention has been particularly shown and described with the reference to the preferred embodiment thereof, it will be understood by those skilled in the art that various changes in form and details may be made without departing from the spirit and scope of the invention.

What is claimed is:

1. A method of forming self-aligned contacts on a semiconductor substrate, which comprises the steps of:

providing a semiconductor substrate;

forming a gate electrode structure having a vertical sidewall and a first protecting layer thereon over said semiconductor substrate;

forming a first doped region in a portion of said semiconductor substrate adjacent to said gate electrode structure;

forming a insulating sidewall spacer on said sidewall of said gate electrode structure;

forming a second doped region in a portion of said semiconductor adjacent to said sidewall spacer;

forming a second protecting layer to non-conformally blanket said first protecting layer, said insulating sidewall spacer, and said semiconductor substrate;

forming a interlayer insulating layer on said second protecting layer to form a planar surface;

etching said interlayer insulating layer and said second protecting layer at a determined position to expose said second doped regions, and;

forming a double spacer composed of a second protecting layer residue adjacent to said insulating sidewall spacer and said insulating sidewall spacer, thereby forming said self-aligned contacts.

2. The method as claimed in claim 1, wherein said second protecting layer is formed by plasma-enhanced chemical vapor deposition.

3. The method as claimed in claim 1, wherein said second protecting layer is composed of silicon-containing nitride.

4. The method as claimed in claim 3, wherein said silicon-containing nitride is silicon nitride or silicon oxynitride.

5. The method as claimed in claim 1, wherein said first protecting layer is composed of silicon nitride.

6. The method as claimed in claim 5, wherein said first protecting layer is formed by low-pressure chemical vapor deposition.

7. The method as claimed in claim 1, wherein said insulating sidewall spacer is composed of silicon nitride.

8. The method as claimed in claim 7, wherein said insulating sidewall spacer is formed by low-pressure chemical vapor deposition.

9. The method as claimed in claim 1, wherein said interlayer insulating layer is composed of a material selected from the group comprising of borophosphosilicate glass, borosilicate glass and phosphosilicate glass.

10. The method as claimed in claim 1, wherein said step of etching said interlayer insulating layer and said second protecting layer at a determined position consists the steps of: patterning said interlayer insulating layer to the said second protecting layer using a first etching gas which is more susceptible to said interlayer insulating layer than to said second protecting layer, and patterning said second protecting layer to corresponding said second doped region using a second etching gas.

11. The method as claimed in claim 10, wherein said first etching gas is $CF_4$.

12. The method as claimed in claim 11, wherein said second etching gas is $C_4F_8$.

13. A method of forming self-aligned contacts, which comprises the steps of:

providing a semiconductor substrate;

forming a gate electrode structure having a vertical sidewall and a first protecting layer thereon over said semiconductor substrate;

forming a first doped region in a portion of said semiconductor substrate adjacent to said gate electrode structure;

forming a insulating sidewall spacer on said sidewall of said gate electrode structure;

forming a second doped region in a portion of said semiconductor adjacent to said sidewall spacer;

forming a second protecting layer to non-conformally blanket said first protecting layer, said insulating sidewall spacer and said semiconductor substrate by plasma-enhanced chemical vapor deposition, forming a interlayer insulating layer which is composed of doped silicon oxide on said second protecting layer to form a planar surface; and etching said interlayer insulating layer and said second protecting layer at a determined position to expose said second doped regions, and;

forming a double spacer composed of a second protecting layer residue adjacent to said insulating sidewall spacer and said insulating sidewall spacer, thereby forming said self-aligned contacts.

14. The method as claimed in claim 13, wherein said second protecting layer is composed of silicon-containing nitride.

15. The method as claimed in claim 14, wherein said silicon-containing nitride is silicon nitride or silicon oxynitride.

16. The method as claimed in claim 13, wherein the material of said interlayer insulating layer is selected from the group comprising of borophosphosilicate glass, borosilicate glass and phosphosilicate glass.

17. The method as claimed in claim 13, wherein said first protecting layer is composed of silicon nitride.

18. The method as claimed in claim 17, wherein said first protecting layer is formed by low-pressure chemical vapor deposition.

19. The method as claimed in claim 13, wherein said insulating sidewall spacer is formed of silicon nitride.

20. The method as claimed in claim 19, wherein said insulating sidewall spacers are formed by low-pressure chemical vapor deposition.

* * * * *